US008698386B2

(12) United States Patent
Hsieh et al.

(10) Patent No.: US 8,698,386 B2
(45) Date of Patent: *Apr. 15, 2014

(54) WAVELENGTH CONVERSION STRUCTURE, MANUFACTURING METHODS THEREOF, AND LIGHTING EMITTING DEVICE INCLUDING THE WAVELENGTH CONVERSION STRUCTURE

(71) Applicant: Epistar Corporation, Hsinchu (TW)

(72) Inventors: Min-Hsun Hsieh, Hsinchu (TW); Yi-Jui Hung, Hsinchu (TW); Meng-Yuan Hong, Hsinchu (TW); Ming-Chi Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/874,132

(22) Filed: Apr. 30, 2013

(65) Prior Publication Data

US 2013/0241398 A1 Sep. 19, 2013

Related U.S. Application Data

(63) Continuation of application No. 13/562,093, filed on Jul. 30, 2012, now Pat. No. 8,450,921.

(30) Foreign Application Priority Data

Aug. 5, 2011 (TW) .............................. 100128104 A

(51) Int. Cl.
*H01J 1/62* (2006.01)

(52) U.S. Cl.
USPC ............ 313/498; 313/501; 313/502; 313/506

(58) Field of Classification Search
USPC .................................. 313/498, 501, 502, 506
See application file for complete search history.

(56) References Cited

U.S. PATENT DOCUMENTS

| 5,792,509 A | 8/1998 | Lin |
| 6,576,488 B2 | 6/2003 | Collins, III |

*Primary Examiner* — Vip Patel
(74) *Attorney, Agent, or Firm* — Muncy, Geissler, Olds & Lowe, P.C.

(57) ABSTRACT

A wavelength conversion structure comprises a phosphor layer comprising a first part and a second part formed on the first part, wherein the first part and the second part have a plurality of pores, a first material layer formed in the plurality of pores of the first part, a second material layer formed in the plurality of pores of the second part and a plurality of phosphor particles, wherein the plurality of phosphor particles is distributed in the first material layer and the second material layer.

20 Claims, 4 Drawing Sheets

WAVELENGTH CONVERSION STRUCTURE, MANUFACTURING METHODS THEREOF, AND LIGHTING EMITTING DEVICE INCLUDING THE WAVELENGTH CONVERSION STRUCTURE

REFERENCE TO RELATED APPLICATION

This application is a continuation application of co-pending U.S. application Ser. No. 13/562,093 filed on Jul. 30, 2012, which claims priority to TW Application No. 100128104, filed on Aug. 5, 2011, all of which is hereby incorporated by reference in its entirety.

TECHNICAL FIELD

The application is related to a wavelength conversion structure and the manufacturing method thereof and particularly to a wavelength conversion structure and the manufacturing method thereof with high light extraction efficiency.

DESCRIPTION OF BACKGROUND ART

In recent years, because people have paid more attention to the energy problem, many new lighting tools with low energy consumption have been developed to save the energy. Therefore, the light emitting diode (LED) which has many advantages, such as high lighting efficiency, low power consumption, non-mercury and long lifetime, becomes the promising lighting tool of next generation.

The white LED used for lighting is produced by the blue LED chip and phosphor. The white light emitted from the white LED can be formed by using the blue light, which is emitted from the blue LED chip, to excite the yellow phosphor, for example, YAG (Yttrium Aluminum Garnet, $Y_3Al_5O_{12}$), to emit the yellow light, and then mixing the two lights.

The phosphor coating methods comprise conformal coating method and remote phosphor coating method. The conformal coating method coats the phosphor on the surface of the LED chip to form the phosphor layer. Because the phosphor is directly coated on the LED chip, the phosphor layer has a uniform thickness. But, the light emitted from the phosphor layer may be absorbed by the LED chip and the carrier so the total lighting efficiency of the LED chip may be decreased. On the other hand, when the LED chip emits light, the temperature of the LED chip is around 100° C. to 150° C., and due to the direct contact of the LED chip and the phosphor layer, the heat produced by the LED chip may deteriorate the phosphor layer and decrease the transformation efficiency of the phosphor layer.

The remote phosphor method can solve the above mentioned problems of the conformal coating method. The remote phosphor method separates the phosphor layer and the LED chip to prevent the light emitted by the LED chip directly absorbed by the phosphor layer. And, due to the separation of the phosphor layer and the LED chip, the phosphor layer is not easy to be deteriorated by the heat produced by the LED chip.

When the particles of the phosphor layer absorb the light emitted by the LED chip, the particles are excited and emit the light with another color. However, the light emitted by the particles is omni-directional, including the light emitted toward the LED chip. Since the refractive index of the encapsulation resin is different from that of the phosphor layer, the total reflection of the light emitted by the particles happen easily so the light efficiency is decreased.

SUMMARY OF THE DISCLOSURE

A wavelength conversion structure comprises a phosphor layer comprising a first part and a second part formed on the first part, wherein the first part and the second part have a plurality of pores, a first material layer formed in the plurality of pores of the first part, a second material layer formed in the plurality of pores of the second part and a plurality of phosphor particles, wherein the plurality of phosphor particles is distributed in the first material layer and the second material layer.

A method of manufacturing a wavelength conversion structure comprises the steps providing a substrate, forming a phosphor layer on the substrate, the phosphor layer comprising a first part and a second part, wherein the first part and the second part comprise a plurality of pores, forming a first material layer in the plurality of pores of the first part and forming a second material layer in the plurality of pores of the second part.

A light-emitting device, comprises a substrate, a light-emitting unit disposed on the substrate, a first light guide layer covering the light-emitting unit on the substrate and a wavelength conversion structure on the first light guide layer, wherein the wavelength conversion structure comprises, a phosphor layer comprising a first part and a second part, wherein the first part on the first light guide layer, the second part on the first part, and the first part and the second part have a plurality of pores, a first material layer formed in the plurality of pores of the first part and a second material layer formed in the plurality of pores of the second part.

DETAILED DESCRIPTION OF PREFERRED EMBODIMENTS

Figure 1:
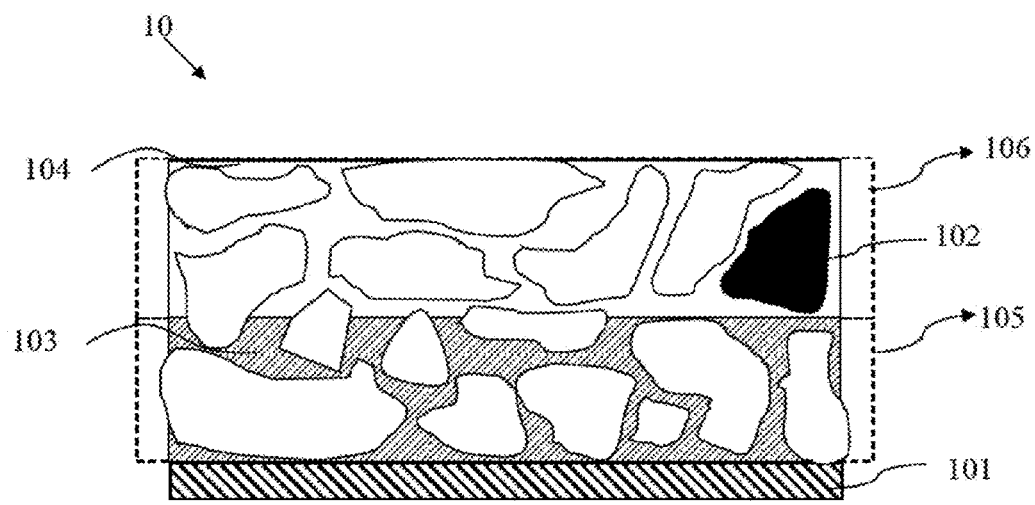
FIG. 1 shows the wavelength conversion structure in accordance with one embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Specially, it needs to be described that when a component or a material layer is described to be disposed on or connected to another one, the component or the material layer may be directly disposed on or connected to another one, or may be indirectly disposed on or connected to another one, that means there is another component or material layer between thereof. On the contrary, when a component or a material layer is described to be directly disposed on or directly connected to another one, there is no any other component or material layer between thereof.

FIG. 1 shows the wavelength conversion structure according to one embodiment of the application. A wavelength conversion structure 10 comprises a conductive substrate 101, a phosphor layer 102, a first material layer 103, and a second material layer 104. The phosphor layer 102 on the conductive substrate 101 comprises phosphor particles, wherein multiples pores are between the phosphor particles. The phosphor layer 102 comprises a first part 105 and a second part 106, wherein the first part 105 is on the conductive substrate 101, the second part 106 is on the first part 105, and the sum of the thickness of the first part 105 and the second part 106 is equal to the thickness of the phosphor layer 102. The first material layer 103 is on the conductive substrate 101, and the first material layer 103 is formed by filling the pores of the first part 105 with inorganic compound to form a thin film, wherein the thickness of the thin film is smaller than the phosphor layer 102. The second material layer 104 on the first material layer 103 is formed by filling the pores of the second part 106 with glue.

The conductive substrate 101 is transparent and electrically conductive and the material the conductive substrate 101 can be, but not limited to transparent conductive inorganic compound (TCO). The phosphor layer 102 is formed on the conductive substrate 101, wherein the material of the phosphor layer 102 can include but not limited to yellow ceramic phosphor. The diameter of the phosphor particles of the phosphor layer 102 is in a range of 225 nm~825 nm, and there are pores between the phosphor particles. The phosphor layer 102 comprises the first part 105 and the second part 106, wherein the thickness of the first part 105 is smaller than the thickness of the phosphor layer 102, and the ratio of the thickness of the first part 105 to the thickness of the phosphor layer 102 is in a range of 0.5~0.9. The thickness of the second part 106 is equal to the difference of the thickness between the phosphor layer 102 and the first part 105.

Figure 2:
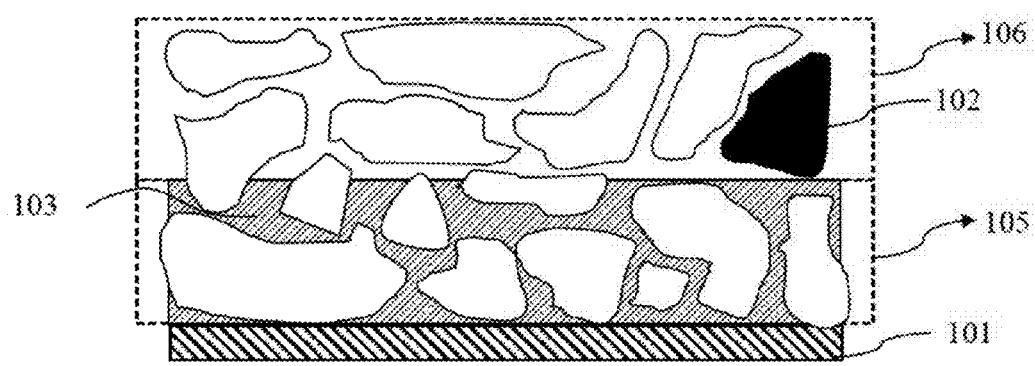
FIG. 2 shows the first part of the wavelength conversion structure with the first material layer disposed thereon.

FIG. 2 shows the inorganic compound is filled in the pores of the first part 105 between the phosphor particles to form the first material layer 103. The material of inorganic compound can include but not limited to ZnO, $Al_2O_3$, ITO, AZO or InGaZnO (IGZO). Take the phosphor layer 102 of yellow ceramic phosphor for example, the refractive index of the yellow ceramic phosphor is about 2, the material of inorganic compound is preferably selected from the material, of which the refractive index is near 2, such as ZnO of which the refractive index is about 1.8 to 2. It may reduce the loss of the lighting efficiency due to the difference of the refractive index between the first material layer 103 and the phosphor layer 102 are similar, wherein the difference between refractive index of the phosphor layer 102 and that of the first material layer 103 is smaller than 0.3. The inorganic compound which is filled in the pores between the phosphor particles is also used for binding the phosphor particles to increase the mechanical strength of the phosphor layer 102.

The glue is filled in the pores of the second part 106 to form the second material layer 104 in the wavelength conversion structure 10 as shown in FIG. 1. The material of the second material layer 104 can include but not limited to silicon, of which the refractive index is about 1.45. In another embodiment, the material of the second material layer 104 comprises other material such as glass (refractive index is 1.5~1.9), resin (refractive index is 1.5~1.6), $TiO_2$ (refractive index is 2.2~2.4), $SiO_2$ (refractive index is 1.5~1.7) or MgF (refractive index is about 1.38). The material of the second material layer 104 can also include inorganic and organic material, of which the refractive index is about between 1.3 and 1.6.

Figure 3:
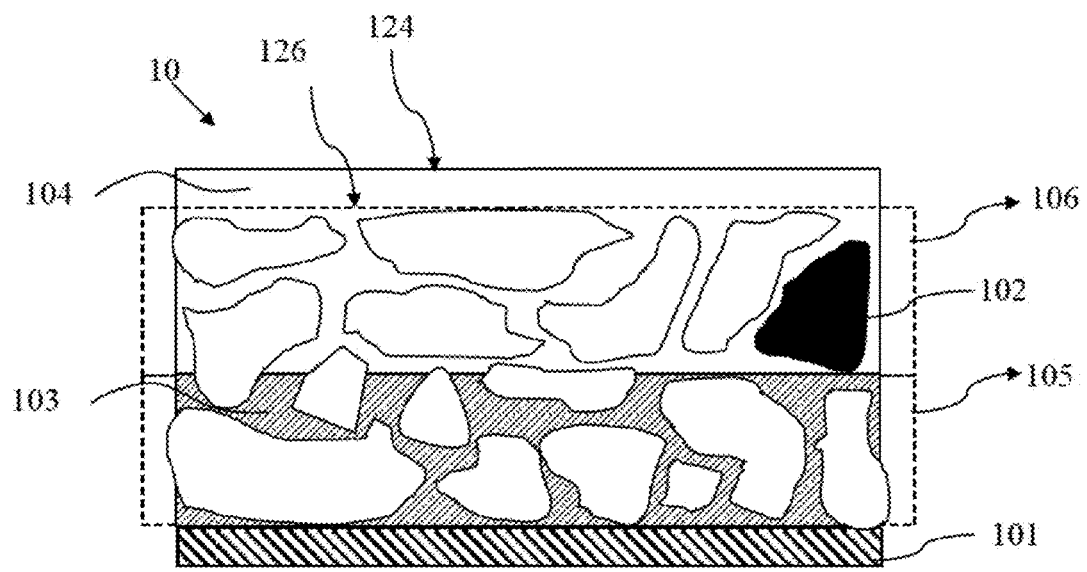
FIG. 3 shows the upper surface of the second material layer of the second part higher than the top surface of the phosphor layer.

The thickness of the second part 106 is equal to the difference of the thicknesses between the phosphor layer 102 and the first part 105. In another embodiment, the thickness of the second material layer 104 is larger than the thickness of the second part 106, and the upper surface 124 of the second material layer 104 is higher than the top surface 126 of the phosphor layer 102, which results in a smoother surface of the wavelength conversion structure 10 as FIG. 3 shows.

Figure 4:
FIG. 4 shows the scanning electron microscope (SEM) diagram of the phosphor layer of the wavelength conversion structure.
Figure 5:
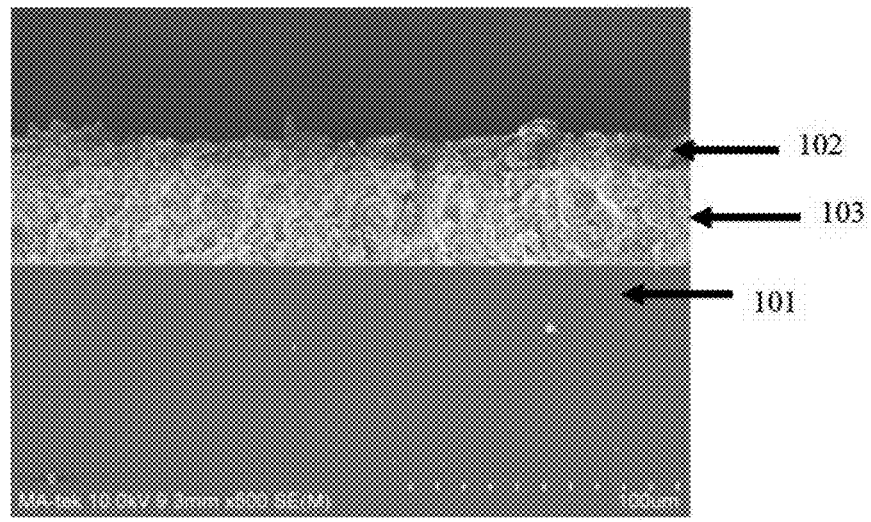
FIG. 5 shows the scanning electron microscope (SEM) diagram of the phosphor layer on the first material layer.
Figure 6:
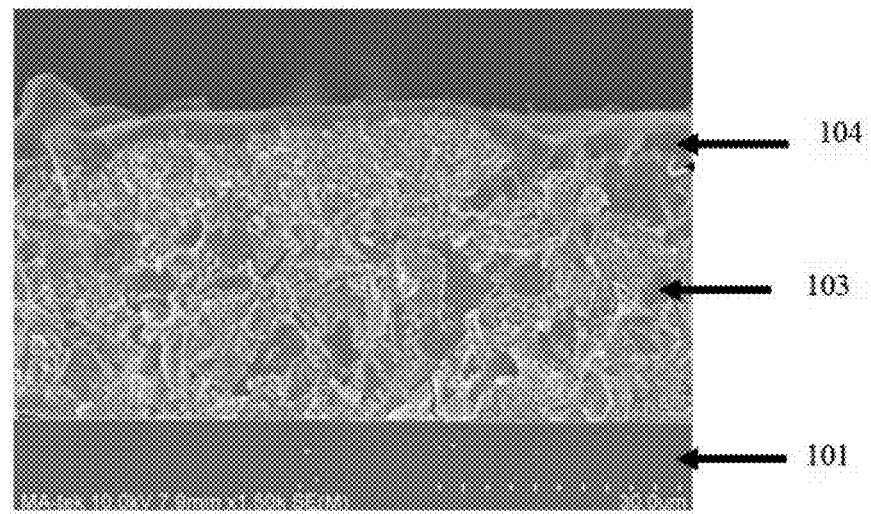
FIG. 6 shows the scanning electron microscope (SEM) diagram of the second material layer on the first material layer.

Thereinafter, the manufacturing method of the wavelength conversion structure 10 is introduced according to the embodiment. First, the conductive substrate 101 is disposed into an electrophoresis apparatus, wherein the conductive substrate 101 can be ITO glass. The phosphor particles are deposited on the surface of the ITO glass by electrophoresis technology to form a phosphor layer 102, and the scanning electron microscope (SEM) picture is shown in FIG. 4. The phosphor layer 102 comprises a material such as phosphor to convert the light of the first wavelength into the light of the second wavelength. The technology to deposit the phosphor layer 102 is not limited to the electrophoresis technology, and also comprises gravity deposition. Next, the transparent inorganic compound such as ZnO is deposited into the pores of the first part 105 of the phosphor layer 102 by electroplating to form the first material layer 103. By filling the pores of the first part 105 with the transparent oxide, of which the refractive index is closer to the phosphor, it reduces the loss from light scattering and increases the light extracting efficiency. The inorganic compound may be used for binding the phosphor particles to enhance the mechanical strength of the phosphor layer 102, which is shown in the scanning electron microscope (SEM) diagram of FIG. 5. During the deposition process, the thickness of the first material layer 103 is adjustable based on the sizes of the phosphor particles and/or the pores. The method of depositing the first material layer 103 is not limited to electroplating and also comprises other methods that can fill the inorganic compound into the pores of the first part 105, such as chemical vapor deposition (CVD) and sol-gel. Finally, the second part 106 of the phosphor layer 102 is filled with glue, which is shown in the scanning electron microscope (SEM) diagram of FIG. 6. The detail steps of filling with glue are well known by the person skilled in the art, and these are not described here again. The thickness of the wavelength conversion structure 10 can be uniform or non-uniform.

Figure 7:
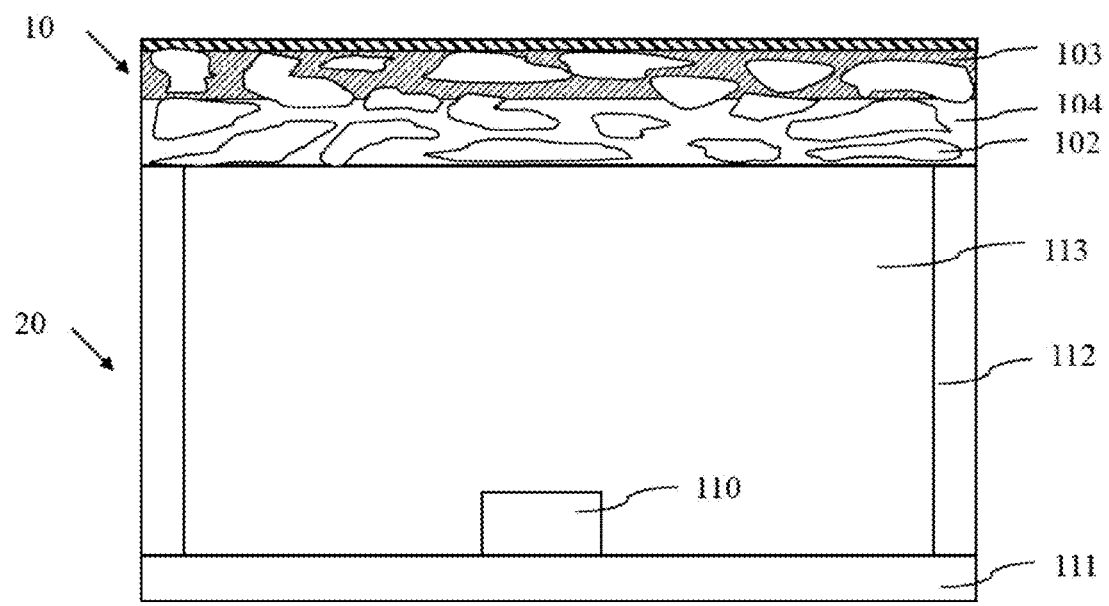
FIG. 7 shows the light emitting device in accordance with one embodiment of the present application.

The diagram of the light emitting device according to another embodiment is shown in FIG. 7. The light emitting device 20 comprises a packaging substrate 111, a light emitting diode 110, a lead frame 112, a light guide layer 113, and a wavelength conversion structure 10. The light emitting diode 110 is located on the packaging substrate 111. The light guide layer 113 covers the packaging substrate 111 and the light emitting diode 110. The light emitting device 20 includes the above-mentioned wavelength conversion structure 10, wherein the wavelength conversion structure 10 and the light emitting diode 110 are separated by the lead frame 112, and the phosphor does not directly contact the light emitting diode 110, which prevents the light emitted from the phosphor layer 102 directly absorbed by the light emitting diode 110. Also, because the phosphor is separated from the light emitting diode 110, the heat from the light emitting diode 110 dose not easily influence the phosphor and the phosphor of the phosphor layer 102 does not deteriorate easily.

The light guide layer 113 in the embodiment is a light passing layer, which can be a material layer to improve the light extraction efficiency. In this embodiment, the light guide layer 113 has multiple material layers with gradient refractive index (GRIN). In this embodiment, the multiple material layers of the light guide layer 113 can include but not limited to $Si_3N_4$ (refractive index is 1.95), $Al_2O_3$ (refractive index is 1.7), and silicone (refractive index is 1.45). In another embodiment, the multiple material layers of the light guide layer 113 can also include the combination of other materials. Because the difference of the refractive indices between the adjacent layers of the multiple material layers of the light guide layer 113 is small and the refractive index is smaller as the layer of the multiple material layers of the light guide layer 113 away from the light emitting diode 110, the light guide layer 113 is able to reduce the total reflection. The multiple material layers of the light guide layer 113 can include but not limited to the combination of glass (refractive index is 1.5~1.9), resin (refractive index is 1.5~1.6), diamond like carbon (DLC, refractive index is 2.0~2.4), titanium ($TiO_2$, refractive index is 2.2~2.4), silicon oxide ($SiO_2$, refractive index is 1.5~1.7), or magnesium fluoride (MgF, refractive index is 1.38). In this embodiment, the light emitting diode 110 can be GaN blue light LED chip, of which the refractive index is 2.4. Therefore, by using the small difference of the refractive indices between the adjacent layers and the gradient refractive index, it is able to reduce the total reflection of the light emitted from the light emitting diode 110.

In the light emitting device 20, the wavelength conversion structure 10 is disposed on the light guide layer 113. The light emitted from the light emitting diode 110 passes through the light guide layer 113 and enters the wavelength conversion structure 10. After passing through the light guide layer 113 having the multiple material layers and entering the second material layer 104 with smaller refractive index than the light guide layer 113, the light enters the phosphor layer 102 and the first material layer 103, wherein the refractive indices thereof are similar. Since the difference of refractive indices between the adjacent layers is small, it is able to prevent the light loss due to the total reflection. And, since the refractive indices of the inorganic compound and phosphor particles are similar, it is also able to reduce the scattering between the phosphor particles. In this embodiment, the light emitting device 20 is a flat encapsulating structure. In other embodiments, the conductive substrate 101 of the wavelength conversion structure 10 is not limited to be a flat panel, and also can be a convex, a concave or a triangle cones. In other words, the surface of the conductive substrate 101 can be a flat surface, a curved surface, or a convex surface.

Table 1 shows the comparison of the testing light extraction efficiency of the light emitting device 20 with the wavelength conversion structure 10, wherein the light extraction efficiencies of the pores of the phosphor layer 102 filled with only silicone and filled with inorganic compound (ITO), ZnO and silicone are compared. According to Table 1, the light extraction efficiency of the light emitting device 20 is 32.15 Lumen/Watt, as the pores of the phosphor layer 102 are filled with only silicone; the light extraction efficiency of the light emitting device 20 is in a range 35.9~36.8 Lumen/Watt, as the pores of the phosphor layer 102 are filled with ITO, ZnO and silicone, wherein the light extraction efficiency of the light emitting device 20 is 35.9, as the ZnO plating duration is 45 min, and the light extraction efficiency of the light emitting device 20 is 36.8, as the ZnO plating duration is 90 min. In this embodiment, the light extraction efficiency of the wavelength conversion structure 10 comprising inorganic compound mixed with silicone is 14% higher than that of the wavelength conversion structure 10 without inorganic compound. The light extraction efficiency of the wavelength conversion structure 10 comprising ZnO of which the plating duration is 90 min is higher than that of the wavelength conversion structure 10 comprising ZnO of which the plating duration is 45 min.

TABLE 1

The light extraction efficiency vs. the composition of the wavelength conversion structure 10

| | Light extraction efficiency [Lumen/Watt] | Comparison of the Light extraction efficiency (%) |
|---|---|---|
| Silicone, without ITO and ZnO | 32.1521 | Reference |
| Plating ZnO 90 min + silicone with ITO | 36.80457 | 14.47 |
| Plating ZnO 45 min + silicone with ITO | 35.909533 | 11.69 |

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a light source configured to emit a light; and
   a wavelength conversion structure configured to convert the light into a converted light, comprising a plurality phosphor particles, a first material layer surrounding a portion of the plurality phosphor particles, and
   a second material layer on the first material layer and surrounding another portion of the plurality of phosphor particles.

2. A light-emitting device according to claim 1, further comprises a substrate on a side of the first material layer, wherein the first material layer is between the substrate and the second material layer.

3. A light-emitting device according to claim 2, wherein the substrate is conductive.

4. A light-emitting device according to claim 2, wherein the substrate has a flat surface.

5. A light-emitting device according to claim 2, Wherein the substrate has a curved surface.

6. A light-emitting device according to claim 2, wherein the refractive index of the substrate is smaller than that of the phosphor particles.

7. A light-emitting device according to claim 1, wherein the first material layer comprises metallic oxide.

8. A light-emitting device according to claim 1, wherein the second material layer comprises silica or glass.

9. A light-emitting device according to claim 1, wherein the refractive index of the first material layer is between 1.8 and 2.

10. A light-emitting device according to claim 1, wherein the refractive index of the second material layer is between 1.3 and 1.6.

11. A light-emitting device according to claim 1, wherein the phosphor particles comprises yellow phosphor.

12. A light-emitting device according to claim 1, wherein a thickness of the first material layer is 1 to 9 times a thickness of the second material layer.

13. A light-emitting device according to claim 1, wherein the concentration of the phosphor particles of the second material layer near the first material layer is higher than that near an upper surface of the second material layer.

14. A light-emitting device according to claim 1, wherein the difference of refractive index between one of the phosphor particles and the first material layer is smaller than 0.3.

15. A light-emitting device according to claim 1, wherein the light source comprises a light emitting diode.

16. A light-emitting device, according to claim 1, further comprises a packaging substrate, wherein the light source disposed on the packaging substrate, a first light guide layer covering the light-emitting unit on the packaging substrate, wherein the wavelength conversion structure is on the first light guide layer.

17. A method of manufacturing a light-emitting device comprising the steps;

providing a light source configured to emit a light; and providing a wavelength conversion structure configured to convert the light into a converted light, comprising the steps:

providing a substrate;

forming a phosphor layer on the substrate, the phosphor layer comprising a plurality of phosphor particles;

forming a first material layer surrounding a portion of the plurality phosphor particles; and forming a second material layer on the first material and surrounding the other portion of the plurality phosphor particles.

18. A method of manufacturing a light-emitting device according to claim 17, wherein the plurality of phosphor particles is formed on the substrate by electrophoresis or gravity deposition method.

19. A method of manufacturing a light-emitting device according to claim 17, wherein the first material layer is formed by electroplating method, chemical vapor deposition method, or sol-gel method.

20. A method of manufacturing a light-emitting device according to claim 17, wherein the second material layer is formed by filling with glue.

* * * * *